(12) United States Patent
Lin

(10) Patent No.: US 9,674,973 B1
(45) Date of Patent: Jun. 6, 2017

(54) COUPLING AND FIXING STRUCTURE OF PANEL AND CASING OF POWER SUPPLY

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW)

( * ) Notice: Subject to any disclaimer, the term of this patent is extended or adjusted under 35 U.S.C. 154(b) by 0 days.

(21) Appl. No.: 15/148,735

(22) Filed: May 6, 2016

(51) Int. Cl.
| H05K 5/00 | (2006.01) |
| H05K 5/02 | (2006.01) |
| H05K 5/03 | (2006.01) |
| H02G 3/14 | (2006.01) |
| H02G 3/12 | (2006.01) |
| G06F 1/18 | (2006.01) |

(52) U.S. Cl.
CPC ............. *H05K 5/0217* (2013.01); *H05K 5/03* (2013.01); *G06F 1/188* (2013.01); *H02G 3/126* (2013.01); *H02G 3/14* (2013.01)

(58) Field of Classification Search
CPC .......... H02G 3/14; H02G 3/126; G06F 1/181; G06F 1/188; H05K 5/0217; H05K 5/03
USPC ................................................ 361/724, 807
See application file for complete search history.

(56) References Cited

U.S. PATENT DOCUMENTS

| 3,922,047 A * | 11/1975 | Tsuji ...................... B60K 37/04 312/242 |
| 4,868,715 A * | 9/1989 | Putman .................. B60K 37/04 248/27.1 |
| 4,947,457 A * | 8/1990 | Shin ........................ H04B 1/082 455/345 |
| 7,643,279 B1 * | 1/2010 | Yu .......................... G06F 1/1601 248/917 |
| 9,442,537 B2 * | 9/2016 | Tsai ........................ G06F 1/182 |

* cited by examiner

*Primary Examiner* — James Wu
(74) *Attorney, Agent, or Firm* — Ming Chow; Sinorica, LLC

(57) ABSTRACT

A coupling and fixing structure of a panel and a casing of a power supply is provided. The power supply further includes a frame. The casing has an opening and a plurality of raised studs. The casing, the frame and the panel have a plurality of penetrating holes and a plurality of through holes. The frame and the panel have a plurality of positioning holes corresponding to the raised studs. The frame and the panel are engaged with each other and positioned at the opening of the casing through the positioning holes and the raised studs and locked with screws so as to complete the assembly of the panel and the casing. The present invention can strengthen the connection of the panel and the casing, decrease the times of locking, lower the risk of damaging components, and improve the efficiency of disassembly and maintenance.

7 Claims, 6 Drawing Sheets

COUPLING AND FIXING STRUCTURE OF PANEL AND CASING OF POWER SUPPLY

BACKGROUND OF THE INVENTION

1. Field of the Invention

The present invention relates to a fixing structure, and more particularly to a coupling and fixing structure of a panel and a casing of a power supply.

2. Description of the Prior Art

Under the rapid development of the electronic information industry, people need to use complicated computer and information equipment for data processing. For example, there are a considerable number of computer hosts, hubs and power supplies in the IT room of an Internet company or an enterprise. Various computer and information apparatuses are installed on a rack for use, such that the computer and information apparatuses can be arranged neatly to decrease the space for storage. It is convenient to connect the signal lines and the power lines of the apparatuses, operate computer and information apparatuses, and check the state of use for the computer and information apparatuses.

A conventional power supply comprises a panel and a casing. The front side of the casing has a rectangular opening. The casing has a plurality of threaded holes close to the rectangular opening. The threaded holes are disposed at the top side, left and right sides, and bottom side of the casing, and the threaded holes are spaced from each other. The opening of the casing is further provided with a face frame. The face frame has a plurality of screw holes corresponding to the threaded holes of the casing. The face frame is further provided with a plurality of connecting pieces. The connecting pieces are connected with the panel and the face frame through screws and threaded holes for the face frame to support the panel. The threaded holes of the casing and the threaded hole of the face frame are locked with screws to complete the assembly of the panel and the casing.

In general, there are dozens of cabinets or thousands of cabinets in a machine room. Each cabinet may be provided with a number of racks for placement of casings. The racks are to support the bottoms of the casings. When it is necessary to assemble or maintain the equipment, the casings must be disassembled from the racks. The screws at the bottom side of the casing must be detached from the threaded holes. Besides, there are numerous electronic components in the casing. It is not easy to manage various screws used for the casing. The length of screws may be too long, which causes damages to the electronic components or a risk of a short circuit.

Accordingly, the inventor of the present invention has devoted himself based on his many years of practical experiences to solve these problems.

SUMMARY OF THE INVENTION

The primary object of the present invention is to provide a coupling and fixing structure of a panel and a casing of a power supply to strengthen the connection of the panel and the casing and to decrease the times of locking the panel and casing screws and to lower the risk of damaging the components.

In order to achieve the aforesaid object, a coupling and fixing structure of a panel and a casing of a power supply is provided. One side of the casing has an opening. The casing has a plurality of penetrating holes close to the opening. The penetrating holes are defined as first penetrating holes, second penetrating holes, and third penetrating holes. The first penetrating holes and the third penetrating holes are disposed at a top side of the casing. The second penetrating holes are disposed at left and right sides of the casing. A bottom side of an inner wall of the casing, close to the opening, is provided with a plurality of first raised studs and a plurality of second raised studs. The power supply further comprises a frame. The frame has a plurality of first through holes and a plurality of second through holes corresponding to the first penetrating holes and the second penetrating holes, respectively. The frame has a plurality of first positioning holes corresponding to the first raised studs of the casing. A circumferential edge of the frame is formed with a plurality of first notches and a plurality of second notches corresponding to the third penetrating holes and the second raised studs of the casing. The panel is provided with a plurality of connecting pieces and a plurality of positioning pieces corresponding to the first notches and the second notches. The connecting pieces have third through holes corresponding to the third penetrating holes of the casing. The positioning pieces have second positioning holes corresponding to the second raised studs of the casing. Left and right sides of the panel are provided with a plurality of first threaded holes and retaining plates. The retaining plates each have an L-like shape. One end of each retaining plate has a plurality of second threaded holes corresponding to the second through holes of the frame. Another end of each retaining plate has a plurality of third threaded holes corresponding to the first threaded holes of the panel. The retaining plates are locked to the panel through screws.

When the operator wants to fix the panel to the casing, the frame is first positioned and engaged at an inner side of the opening of the casing, and then the panel is locked to the casing through the retaining plates to complete the assembly of the panel and the casing. The present invention can strengthen the connection of the panel and the casing, decrease the times of locking the panel and casing screws, lower the risk of damaging the components, and improve the efficiency of disassembly and maintenance.

DETAILED DESCRIPTION OF THE PREFERRED EMBODIMENTS

Embodiments of the present invention will now be described, by way of example only, with reference to the accompanying drawings.

Figure 1:
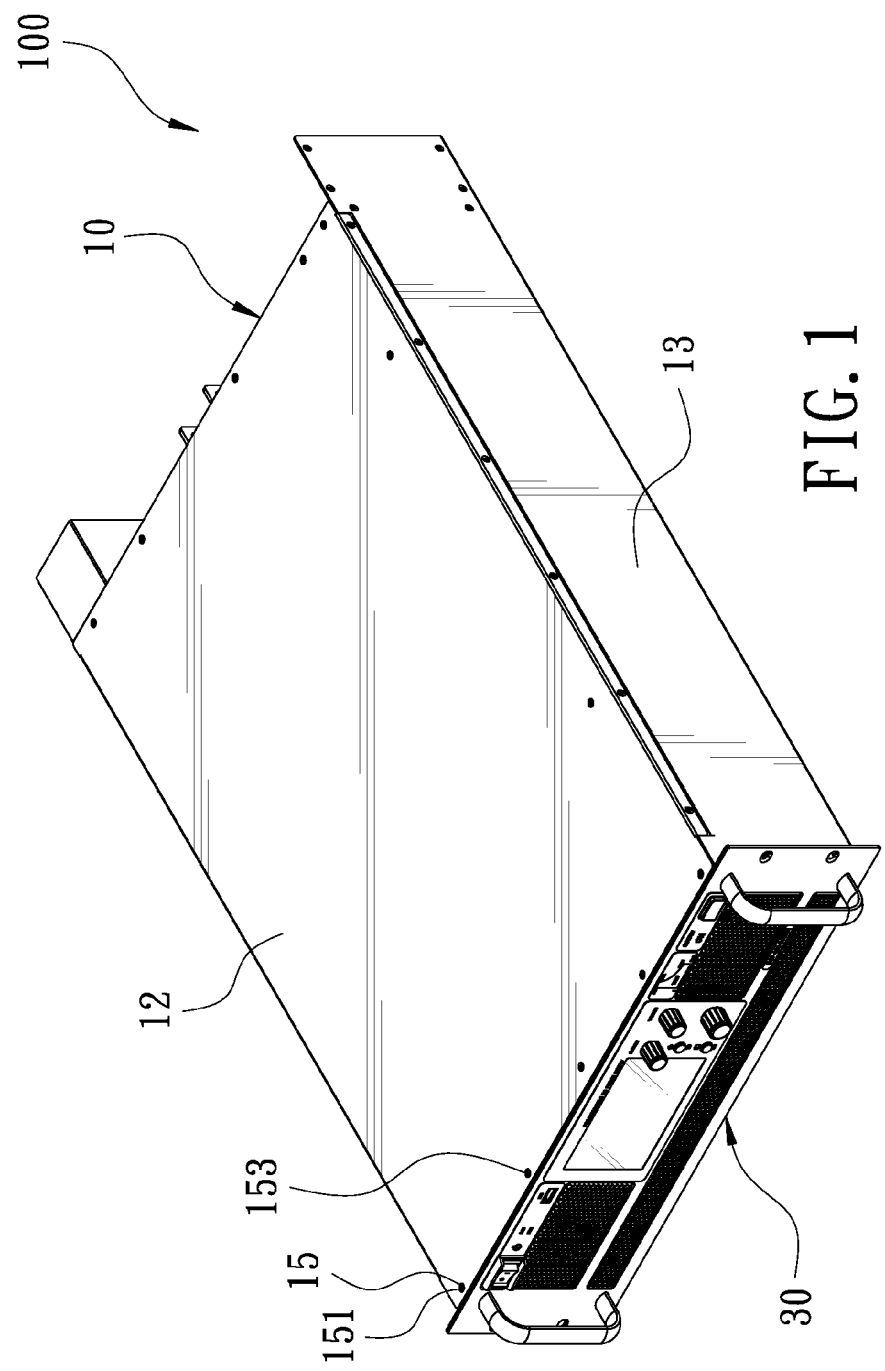
FIG. 1 is a perspective view in accordance with a preferred embodiment of the present invention, showing the panel and the casing after assembled.
Figure 2:
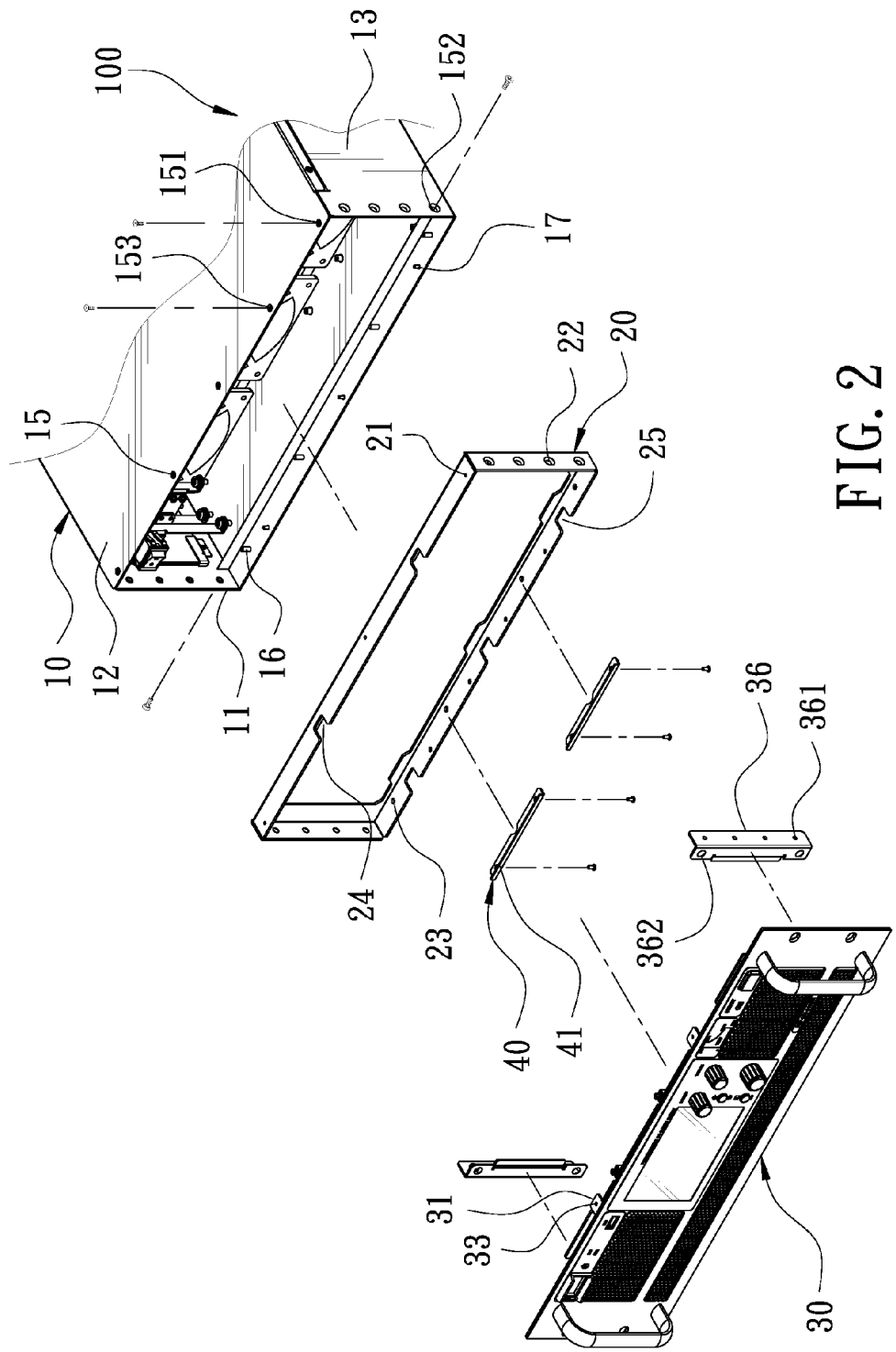
FIG. 2 is an exploded view in accordance with the preferred embodiment of the present invention.
Figure 3:
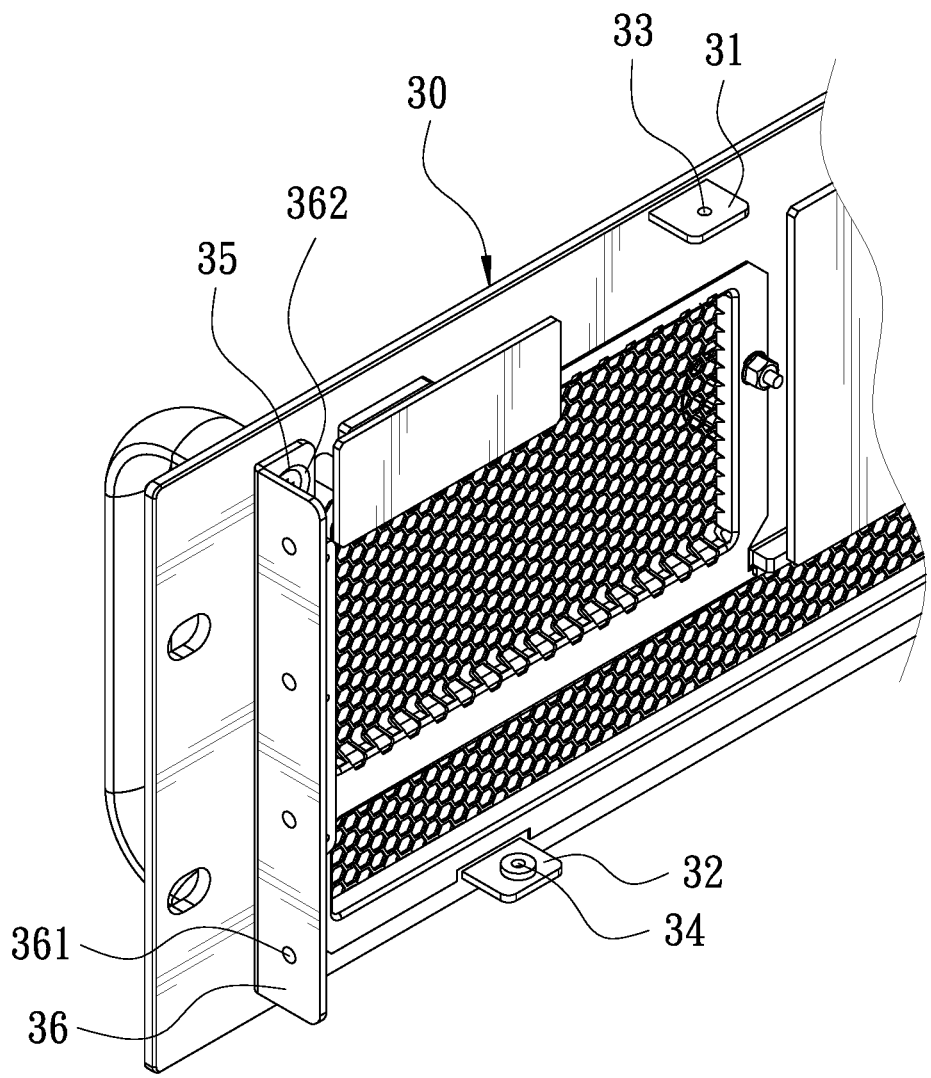
FIG. 3 is a schematic view in accordance with the preferred embodiment of the present invention when in use, showing the retaining plate locked to the panel.

FIG. 1 is a perspective view of the present invention. FIG. 2 is an exploded view of the present invention. FIG. 3 is a schematic view of the present invention when in use. The present invention discloses a coupling and fixing structure of a panel and a casing of a power supply. A power supply 100 in accordance with a preferred embodiment of the present invention comprises a casing 10, a frame 20, a panel 30, and two reinforcement ribs 40.

One side of the casing 10 has an opening 11. The casing 10 is composed of an upper cover 12 and a main body 13. One side of the upper cover 12 and the main body 13 is formed with the opening 11. The casing 10 has a plurality of penetrating holes 15 close to the opening 11. The penetrating holes 15 are defined as first penetrating holes 151, second penetrating holes 152, and third penetrating holes 153. The first penetrating holes 151 and the third penetrating holes 153 are disposed at a top side of the casing 10. Preferably, the first penetrating holes 151 and the third penetrating holes 153 are located on the upper cover 12. The second penetrating holes 152 are disposed at left and right sides of the casing 10. Preferably, the second penetrating holes 152 are located on the main body 13. A bottom side of an inner wall of the casing 10, close to the opening 11, is provided with a plurality of first raised studs 16 and a plurality of second raised studs 17. Preferably, the first raised studs 16 and the second raised studs 17 are located on the main body 13. In this embodiment of the present invention, the first raised studs 16 and the second raised studs 17 of the casing 10 are screw studs. The first raised studs 16 and the second raised studs 17 of the casing 10 are spaced from each other.

In this embodiment of the present invention, the frame 20 is disposed at an inner side of the opening 11 of the casing 10. An outer periphery of the frame 20 is about equal to an inner periphery of the opening 11 of the casing 10. The frame 20 has a plurality of first through holes 21 and a plurality of second through holes 22 corresponding to the first penetrating holes 151 and the second penetrating holes 152 respectively. The frame 20 has a plurality of first positioning holes 23 corresponding to the first raised studs 16 of the casing 10. A circumferential edge of the frame 20 is formed with a plurality of first notches 24 and a plurality of second notches 25 corresponding to the third penetrating holes 153 and the second raised studs 17 of the casing 10. The first through holes 21 of the frame 20 are threaded holes.

The panel 30 is vertically disposed relative to the first notches 24 and the second notches 25 of the frame 20. The panel 30 is provided with a plurality of connecting pieces 31 and a plurality of positioning pieces 32 corresponding to the first notches 24 and the second notches 25. The connecting pieces 31 each have a third through hole 33 corresponding to the third penetrating hole 153 of the casing 10. The positioning pieces 32 each have a second positioning hole 34 corresponding to the second raised stud 17 of the casing 10. Left and right sides of the panel 30 are provided with a plurality of first threaded holes 35 and a retaining plate 36, respectively. Two sides of the frame 20 are located between the casing 10 and the retaining plates 36 at the left and right sides of the panel 30. The retaining plate 36 has an L-like shape. One end of the retaining plate 36 has a plurality of second threaded holes 361 corresponding to the second through holes 22 of the frame 20. Another end of the retaining plate 36 has a plurality of third threaded holes 362 corresponding to the first threaded holes 35 of the panel 30. The retaining plates 36 at the left and right sides of the panel 30 are locked to the panel 30 through screws. The third through holes 33 of the connecting pieces 31 are threaded holes.

The reinforcement ribs 40 are locked to the inner wall of the frame 20. Each reinforcement rib 40 has a stop edge 41 extending outward and leaning against the panel 30.

Figure 4:
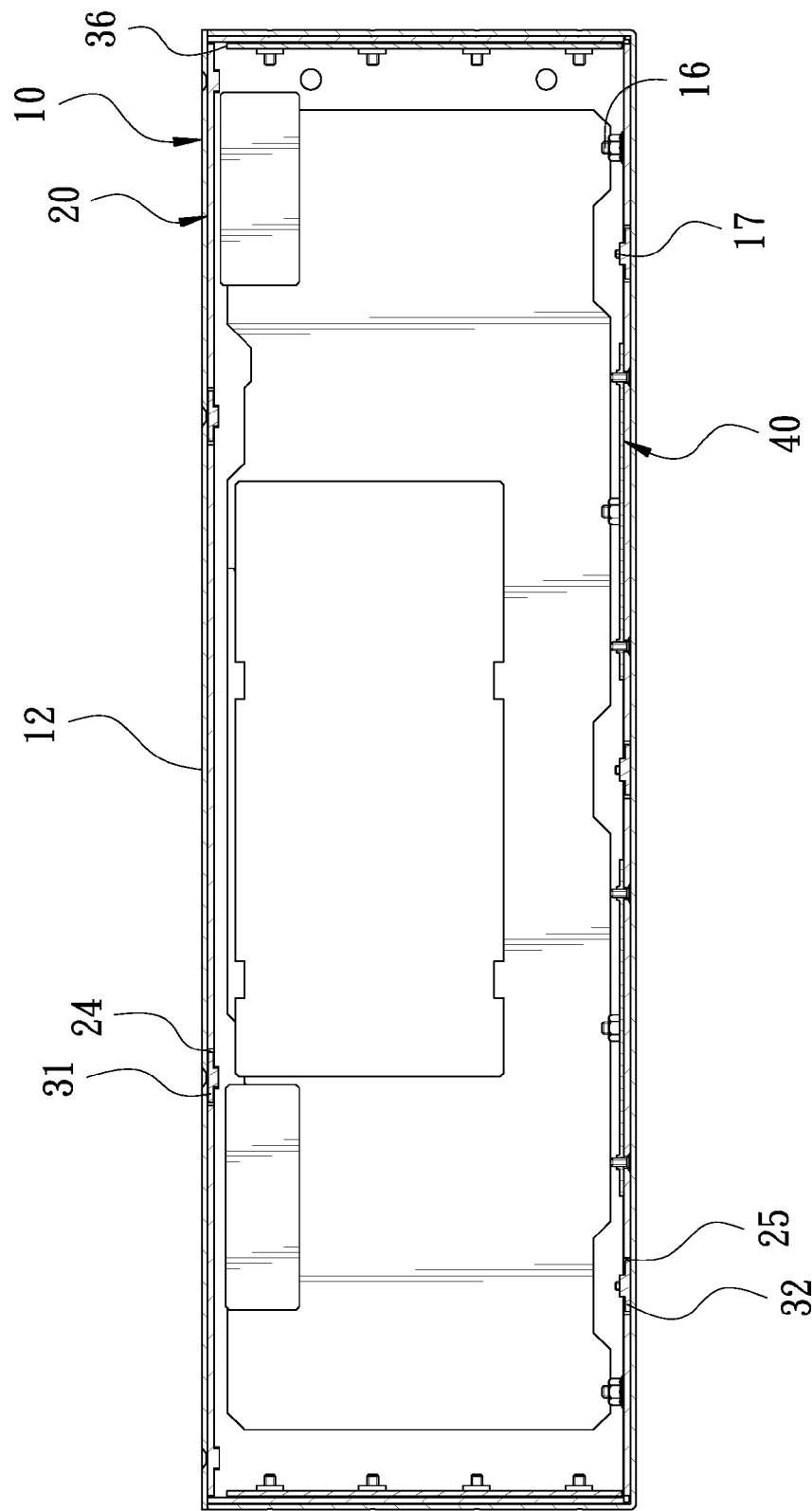
FIG. 4 is a front sectional view in accordance with the preferred embodiment of the present invention, showing the coupling state of the casing and the panel.

FIG. 2 is an exploded view in accordance with the preferred embodiment of the present invention. FIG. 3 is a schematic view in accordance with the preferred embodiment of the present invention when in use. FIG. 4 is a front sectional view in accordance with the preferred embodiment of the present invention. To assemble the panel 30 and the casing 10, the third threaded holes 362 of the retaining plates 36 and the first threaded holes 35 of the panel 30 are locked with screws, such that the retaining plates 36 are locked to the inner side of the panel 30. FIG. 3 is a schematic view in accordance with the preferred embodiment of the present invention when in use, showing the retaining plate 36 locked to the panel. The frame 20 is inserted and positioned at the inner side of the opening 11 of the casing 10. The first raised studs 16 of the casing 10 are inserted through the first positioning holes 23 of the frame 20 and locked with screws to position the frame 20 in the casing 10. The panel 30 is coupled to the casing 10 through the frame 20. The connecting pieces 31 and the positioning pieces 32 are engaged with the first notches 24 and the second notches 25 of the frame 20. The second raised studs 17 of the casing 10 are inserted through the second positioning holes 34 of the positioning pieces 32 and locked with screws to position the panel 30. The first penetrating holes 151 of the casing 10 and the first through holes 21 of the frame 20 as well as the second penetrating holes 152 of the casing 10 and the second through holes 22 of the frame 20 and the second threaded holes 361 of the retaining plates 36 are locked with screws. The third penetrating holes 153 of the casing 10 and the third through holes 33 of the connecting pieces 31 are locked with screws. The panel 30 is coupled and fixed to the casing 10. FIG. 4 is a front sectional view in accordance with the preferred embodiment of the present invention, showing the coupling state of the casing 10 and the panel 30.

Figure 5:
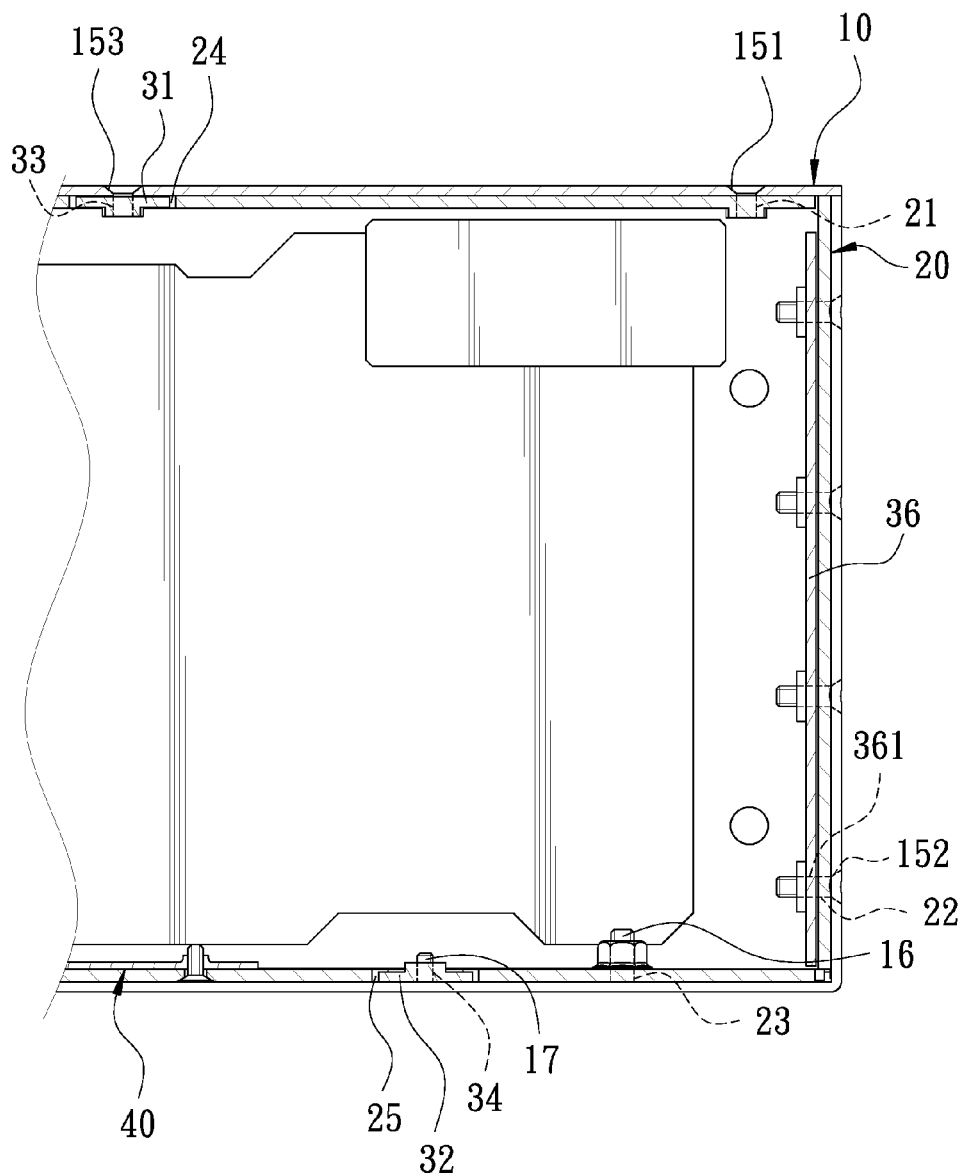
FIG. 5 is a partial enlarged sectional view in accordance with the preferred embodiment of the present invention, showing the coupling state of the casing and the panel.

FIG. 5 is a partial enlarged sectional view in accordance with the preferred embodiment of the present invention, showing the coupling state of the casing 10 and the panel 30. The third penetrating holes 153 of the casing 10 correspond to the third through holes 33 of the connecting pieces 31 of the panel 30. The connecting pieces 31 are engaged with the first notches 24 of the frame 20. The first raised studs 16 and the second raised studs 17 of the casing 10 are positioned by the first positioning holes 23 of the frame 20 and the second positioning holes 34 of the panel 30, respectively. When the casing 10 is mounted to a rack of a cabinet, there is no need for the operator to lock the screws under the main body 13 of the casing 10 by means of a hand tool for disassembly and maintenance. The times to lock the screws can be decreased, and the efficiency of disassembly and maintenance can be improved. The assembly of the power supply can be simplified. The design of raised studs can avoid the electronic components from being damaged.

Figure 6:
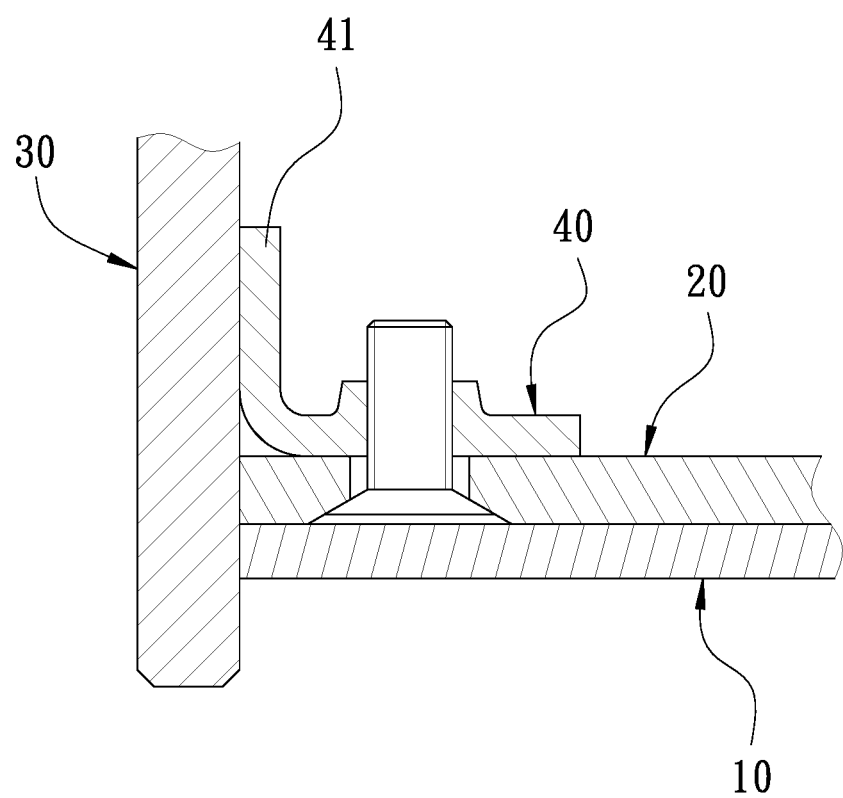
FIG. 6 is a schematic view in accordance with the preferred embodiment of the present invention when in use, showing the retaining plate leaning against the panel.

FIG. 6 is a schematic view in accordance with the preferred embodiment of the present invention when in use, showing the retaining plate 40 leaning against the panel 30. The retaining plates 40 are locked to the frame 20. The panels 30 are indirectly supported by the frame 20. When the user performs operations on the panel 30, the stop edges 41 of the reinforcement ribs 40 lean against the panel 30, enabling the panel 30 to be more stable.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A coupling and fixing structure of a panel and a casing of a power supply, characterized by:

one side of the casing having an opening, the casing having a plurality of penetrating holes close to the opening, the penetrating holes being defined as first penetrating holes, second penetrating holes and third penetrating holes, the first penetrating holes and the third penetrating holes being disposed at a top side of the casing, the second penetrating holes being disposed at left and right sides of the casing, a bottom side of an inner wall of the casing, close to the opening, being provided with a plurality of first raised studs and a plurality of second raised studs;

the power supply further comprising a frame, the frame having a plurality of first through holes and a plurality of second through holes corresponding to the first penetrating holes and the second penetrating holes respectively, the frame having a plurality of first positioning holes corresponding to the first raised studs of the casing, a circumferential edge of the frame being formed with a plurality of first notches and a plurality of second notches corresponding to the third penetrating holes and the second raised studs of the casing;

the panel being provided with a plurality of connecting pieces and a plurality of positioning pieces corresponding to the first notches and the second notches, the connecting pieces having third through holes corresponding to the third penetrating holes of the casing, the positioning pieces having second positioning holes corresponding to the second raised studs of the casing, left and right sides of the panel being provided with a plurality of first threaded holes and retaining plates, the retaining plates each having an L-like shape, one end of each retaining plate having a plurality of second threaded holes corresponding to the second through holes of the frame, another end of each retaining plate having a plurality of third threaded holes corresponding to the first threaded holes of the panel, the retaining plates being locked to the panel through screws;

wherein when the panel is secured to the casing, the frame is first positioned and engaged at an inner side of the opening of the casing, and then the panel is locked to the casing through the retaining plates.

2. The coupling and fixing structure of the panel and the casing of the power supply as claimed in claim 1, further comprising at least one reinforcement rib locked to an inner wall of the frame, the reinforcement rib having a stop edge extending outward and leaning against the panel.

3. The coupling and fixing structure of the panel and the casing of the power supply as claimed in claim 1, wherein the first raised studs and the second raised studs of the casing are screw studs, and the first raised studs and the second raised studs of the casing are spaced from each other.

4. The coupling and fixing structure of the panel and the casing of the power supply as claimed in claim 1, wherein the frame is disposed at the inner side of the opening of the casing, and an outer periphery of the frame is about equal to an inner periphery of the opening of the casing.

5. The coupling and fixing structure of the panel and the casing of the power supply as claimed in claim 1, wherein the panel is vertically disposed relative to the first notches and the second notches of the frame.

6. The coupling and fixing structure of the panel and the casing of the power supply as claimed in claim 1, wherein the first through holes of the frame are threaded holes, and the third through holes of the connecting pieces are threaded holes.

7. The coupling and fixing structure of the panel and the casing of the power supply as claimed in claim 1, wherein two sides of the frame are located between the casing and the retaining plates.

* * * * *